(12) United States Patent
Kim et al.

(10) Patent No.: US 10,979,089 B2
(45) Date of Patent: Apr. 13, 2021

(54) METHOD AND DEVICE FOR MEASURING ANTENNA REFLECTION COEFFICIENT

(71) Applicant: SAMSUNG ELECTRONICS CO., LTD., Suwon-si (KR)

(72) Inventors: Daeyoung Kim, Suwon-si (KR); Youngik Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/599,641

(22) Filed: Oct. 11, 2019

(65) Prior Publication Data

US 2020/0169276 A1 May 28, 2020

(30) Foreign Application Priority Data

Nov. 27, 2018 (KR) .......... 10-2018-0148764
Apr. 4, 2019 (KR) .......... 10-2019-0039743

(51) Int. Cl.
| | | |
|---|---|---|
| H04B 17/00 | (2015.01) |
| H04B 1/04 | (2006.01) |
| G01R 27/06 | (2006.01) |
| H04B 17/12 | (2015.01) |
| H04B 17/10 | (2015.01) |
| H03H 7/38 | (2006.01) |

(52) U.S. Cl.
CPC .......... *H04B 1/0458* (2013.01); *G01R 27/06* (2013.01); *H03H 7/38* (2013.01); *H04B 17/103* (2015.01); *H04B 17/12* (2015.01)

(58) Field of Classification Search
CPC ...... H04B 17/103; H04B 17/12; G01R 27/06; H03H 7/38

USPC ...................................................... 455/115.1
See application file for complete search history.

(56) References Cited

U.S. PATENT DOCUMENTS

| | | | | |
|---|---|---|---|---|
| 8,351,874 B2 * | 1/2013 | Dent | .................... | H04B 1/0458 330/129 |
| 8,558,533 B2 * | 10/2013 | Kuga | .................... | G01R 23/20 324/76.39 |
| 9,124,241 B2 | 9/2015 | Lee | | |
| 9,482,705 B2 | 11/2016 | Hind | | |
| 9,602,211 B2 * | 3/2017 | Yeo | ......................... | H04B 7/022 |
| 9,698,758 B2 | 7/2017 | Spears et al. | | |
| 9,941,959 B2 * | 4/2018 | Heath | ................. | H04L 41/0645 |

(Continued)

FOREIGN PATENT DOCUMENTS

| | | |
|---|---|---|
| JP | 2007166534 | 6/2007 |
| JP | 2013165418 | 8/2013 |

*Primary Examiner* — Sonny Trinh
(74) *Attorney, Agent, or Firm* — F. Chau & Associates, LLC

(57) ABSTRACT

A device for measuring a reflection coefficient of an antenna by using a radio frequency (RF) feedback signal provided by a coupler based on an RF transmission signal provided to the antenna includes a feedback circuit configured to generate a baseband feedback signal by down-converting and filtering the RF feedback signal, and a signal processing device configured to control the down-converting, based on a target frequency band, process a baseband transmission signal and the baseband feedback signal to have the target frequency band, and calculate a reflection coefficient of the antenna corresponding to the target frequency band. The RF transmission signal is generated from the baseband transmission signal.

22 Claims, 11 Drawing Sheets

(56) References Cited

U.S. PATENT DOCUMENTS

| | | |
|---|---|---|
| 10,075,202 B2 | 9/2018 | Wu et al. |
| 10,177,731 B2 * | 1/2019 | McKinzie, III .......... H03H 7/38 |
| 10,404,368 B2 * | 9/2019 | Heath ................... H04L 41/069 |
| 2018/0026369 A1 | 1/2018 | Kim et al. |
| 2020/0169331 A1 * | 5/2020 | Kim ..................... H04B 17/103 |

* cited by examiner

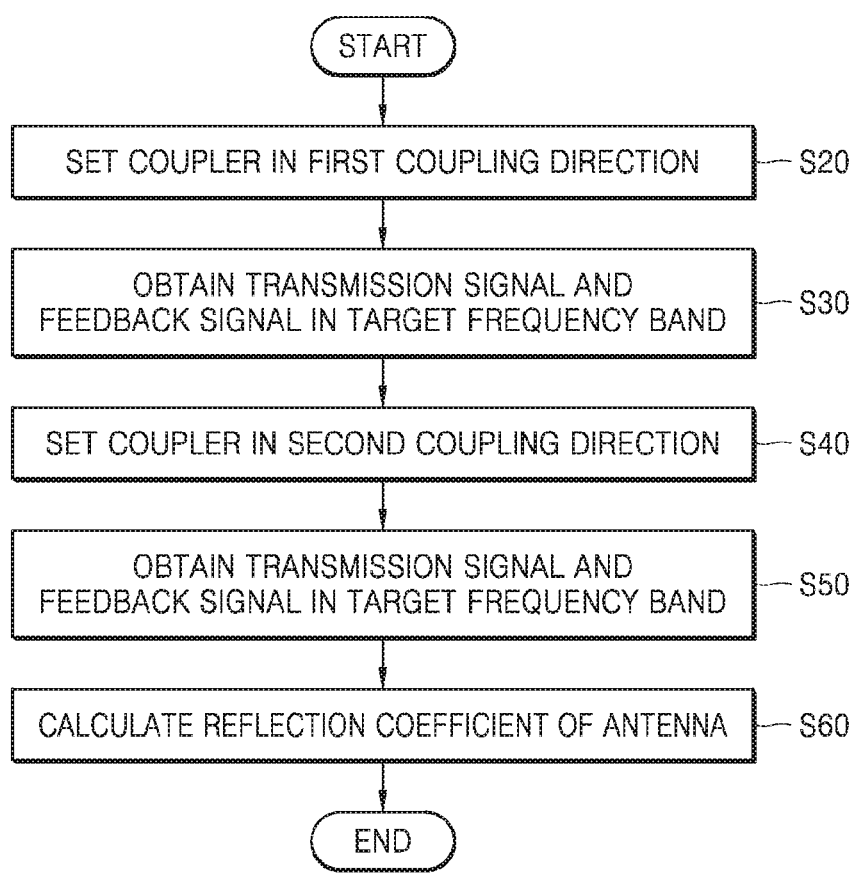

METHOD AND DEVICE FOR MEASURING ANTENNA REFLECTION COEFFICIENT

CROSS-REFERENCE TO RELATED APPLICATIONS

This U.S. non-provisional patent application claims the benefit of priority under 35 USC § 119 to Korean Patent Application No. 10-2018-0148764, filed on Nov. 27, 2018, and Korean Patent Application No. 10-2019-0039743, filed on Apr. 4, 2019, in the Korean Intellectual Property Office, the disclosures of which are incorporated by reference in their entirety herein.

BACKGROUND

1. Technical Field

The inventive concept relates to wireless communication, and more particularly, to a method and device for measuring a reflection coefficient of an antenna that is used for wireless communication.

2. Discussion of Related Art

When an antenna that is used for wireless communication does not have a desired impedance, the quality of wireless communication may be degraded. Wireless communication apparatuses may include the antenna and an antenna tuner. The antenna tuner may be controlled based on a measured impedance or reflection coefficient of the antenna. Accordingly, the reflection coefficient of the antenna needs to be accurately measured. Further, since a component that measures the reflection coefficient of the antenna operates in a wireless communication system using a broadband channel, the component needs to be able deliver high performance. Thus, the component used to measure the reflection coefficient of the antenna may greatly increase the cost of the wireless communication system.

SUMMARY

At least one embodiment of the inventive concept provides a method and device for efficiently measuring the reflection coefficient of an antenna.

According to an exemplary embodiment of the inventive concept, there is provided a signal processing device for measuring a reflection coefficient of an antenna by using a radio frequency (RF) feedback signal provided by a coupler based on an RF transmission signal provided to the antenna, the signal processing device including a digital-to-analog converter (DAC) configured to convert a first digital signal to a baseband transmission signal from which the RF transmission signal is generated; an analog-to-digital converter (ADC) configured to convert a baseband feedback signal generated from the RF feedback signal to a second signal; a digital signal processor configured to process the first digital signal and the second digital signal to have a target frequency band; a buffer configured to store data output by the digital signal processor; and a controller configured to set the target frequency band, control the digital signal processor, based on the target frequency band, and calculate a reflection coefficient of the antenna corresponding to the target frequency band, based on the data stored in the buffer.

According to an exemplary embodiment of the inventive concept, there is provided a device for measuring a reflection coefficient of an antenna by using a radio frequency (RF) feedback signal provided by a coupler based on an RF transmission signal provided to the antenna, the device including a feedback circuit configured to generate a baseband feedback signal by down-converting and filtering the RF feedback signal; and a signal processing device configured to convert a first digital signal into a baseband transmission signal, convert the baseband feedback signal into a second digital signal, and calculate a reflection coefficient of the antenna corresponding to a target frequency band by performing digital signal processing so that the first digital signal and the second digital signal have the target frequency band, wherein the feedback circuit includes an analog filter having a pass band that is narrower than a maximum frequency band of the baseband transmission signal.

According to an exemplary embodiment of the inventive concept, there is provided a device for measuring a reflection coefficient of an antenna by using a radio frequency (RF) feedback signal provided by a coupler based on an RF transmission signal provided to the antenna, the device including a feedback circuit configured to generate a baseband feedback signal by down-converting and filtering the RF feedback signal; and a signal processing device configured to control the down-converting, based on a target frequency band, process a baseband transmission signal and the baseband feedback signal to have the target frequency band, and calculate a reflection coefficient of the antenna corresponding to the target frequency band, wherein the RF transmission signal is generated from the baseband transmission signal.

According to an exemplary embodiment of the inventive concept, there is provided a wireless communication apparatus including an antenna, a transceiver, a coupler, and a signal processor. The transceiver provides a radio frequency (RF) transmission signal based on a baseband signal. The signal processor provides the baseband signal to the transceiver based on a first digital signal. The coupler provides the RF transmission signal to the antenna, and outputs one of a first feedback signal based on the first RF transmission signal, and a second feedback signal based on a signal reflected from the antenna, to the signal processor. The signal processor performs an analog to digital conversion on the first and second feedback signals. The signal processor adjusts the digital transmission signal and the digital feedback signals to have a target frequency band. The signal processor determines a reflection coefficient of the antenna from the adjusted signals.

BRIEF DESCRIPTION OF THE DRAWINGS

Exemplary embodiments of the inventive concept will be more clearly understood from the following detailed description taken in conjunction with the accompanying drawings in which:

FIG. 9 is a flowchart of a method of measuring the reflection coefficient of an antenna, according to an exemplary embodiment of the inventive concept;

DETAILED DESCRIPTION OF THE EXEMPLARY EMBODIMENTS

Figure 1:
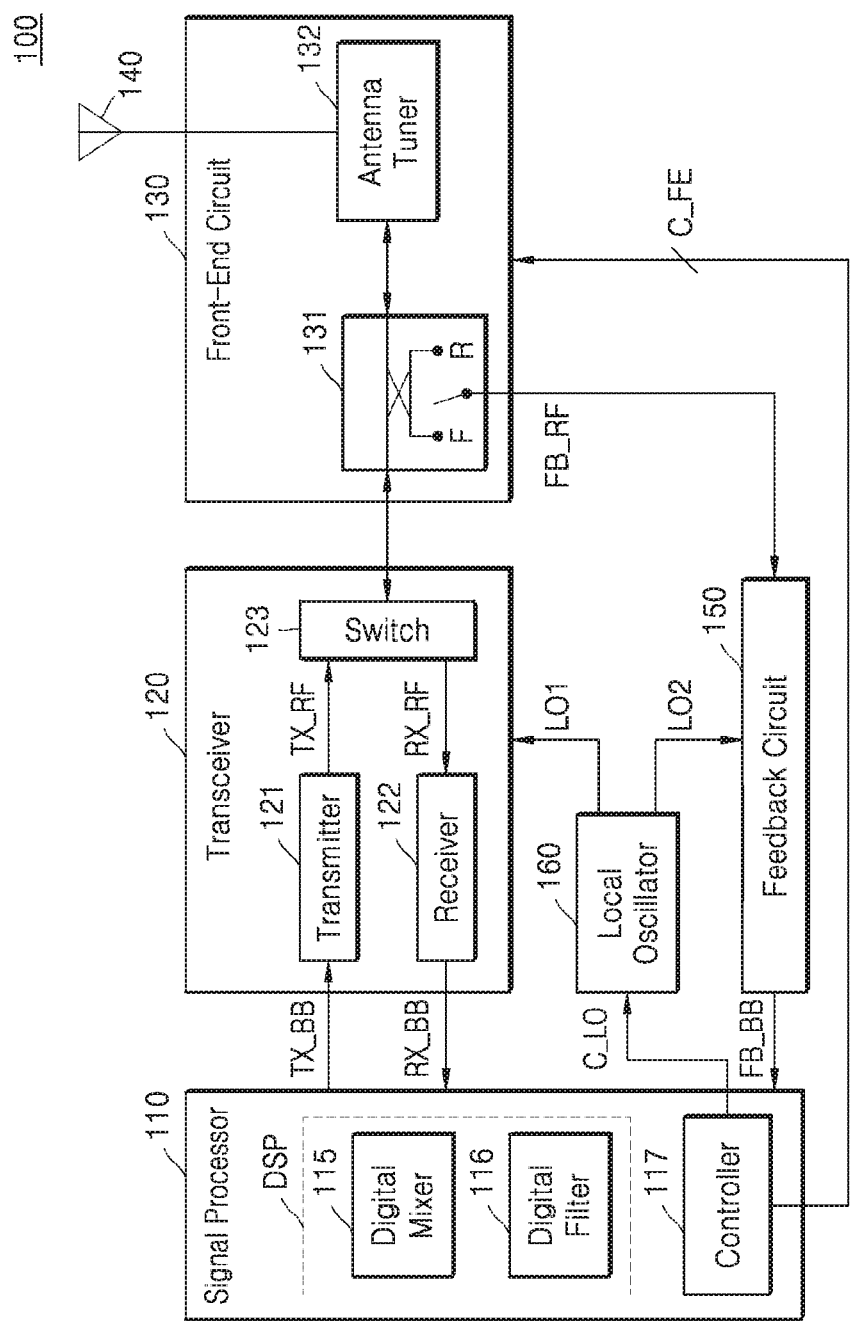
FIG. 1 is a block diagram of wireless communication equipment according to an exemplary embodiment of the inventive concept.

Hereinafter, one or more exemplary embodiments of the inventive concept will be described in detail with reference to accompanying drawings. The present disclosure may, however, be embodied in many different forms and should not be construed as limited to the embodiments set forth herein. Like reference numerals refer to like elements throughout this application.

FIG. 1 is a block diagram of wireless communication equipment 100 according to an exemplary embodiment of the inventive concept. Referring to FIG. 1, the wireless communication equipment 100 includes a signal processor 110, a transceiver 120, an antenna 140, a feedback circuit 150, and a local oscillator 160.

The wireless communication equipment 100 may connect to a wireless communication system by transmitting or receiving a signal via the antenna 140. A wireless communication system to which the wireless communication equipment 100 is connectable may be referred to as radio access technology (RAT). As a non-limiting example, the wireless communication system may be a wireless communication system using a cellular network (such as a 5th generation wireless (5G) system, a Long Term Evolution (LTE) system, an LTE-Advanced system, a Code Division Multiple Access (CDMA) system, a Global System for Mobile Communications (GSM) system), a Wireless Local Area Network (WLAN) system, or another arbitrary wireless communication system. Hereinafter, the wireless communication system to which the wireless communication equipment 100 connects will be assumed to be a wireless communication system using a cellular network, but exemplary embodiments of the inventive concept are not limited thereto.

A wireless communication network of the wireless communication system may support communication between a plurality of pieces of wireless communication equipment including the wireless communication equipment 100 by sharing available network resources. For example, via a wireless communication network, information may be transmitted in various multiple access manners such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), Orthogonal Frequency Division Multiplex (OFDM) FDMA (OFDM-FDMA), OFDM-TDMA, or OFDM-CDMA.

The wireless communication equipment 100 may be referred to as any equipment that connects to a wireless communication system. In general, a base station (BS) as an example of the wireless communication equipment 100 may refer to a fixed station communicating with user equipment (UE) and/or other BSs and may exchange data and control information with the UE and/or the other BSs by communicating with the UE and/or the other BSs. For example, the BS may be referred to as a Node B, an evolved-Node B (eNB), a next generation Node (gNB), a sector, a site, a Base Transceiver System (BTS), an Access Point (AP), a relay node, a Remote Radio Head (RRH), a Radio Unit (RU), or a small cell. In this disclosure, the BS or cell may refer to a function or an area covered by a base station controller (BSC) in CDMA, a Node-B in Wide Band CDMA (WCDMA), an eNB or a sector (site) in LTE, and may include a mega cell, a macro cell, a micro cell, a picocell, a femtocell, and/or various coverage areas, e.g., coverage ranges of a relay node, an RRH, an RU, or a small cell.

UE as an example of the wireless communication equipment 100 may be located at a fixed location or may have mobility and may denote any device capable of receiving and transmitting data and/or control information from and to the BS by communicating with the BS. For example, the UE may refer to terminal equipment, a Mobile Station (MS), a Mobile Terminal (MT), a User Terminal (UT), a Subscriber Station (SS), a wireless device, or a handheld device. In this disclosure, the wireless communication equipment 100 may be assumed to be UE, but exemplary embodiments of the inventive concept are not limited thereto.

Referring to FIG. 1, the antenna 140 is connected to a front-end circuit 130 and may transmit a signal received from the front-end circuit 130 to other wireless communication equipment or may provide a signal received from the other wireless communication equipment to the front-end circuit 130. According to an exemplary embodiment, the wireless communication equipment 100 include a plurality of antennas for a phased array or Multiple-Input and Multiple-Output (MIMO). The antenna 140 has an impedance, and the impedance of the antenna 140 may vary due to various factors. To compensate for a variation in the impedance of the antenna 140, the antenna 140 is connected to an antenna tuner 132 included in the front-end circuit 130, as will be described later. For example, the antenna tuner 132 may adjust the impedance of the antenna 140.

The front-end circuit 130 includes a coupler 131 (e.g., a directional coupler) and the antenna tuner 132. The coupler 131 is connected to the transceiver 120 and the antenna tuner 132. The coupler 131 receives an RF transmission signal TX_RF in a transmission mode and provides, to the feedback circuit 150, a signal coupled to the RF transmission signal TX_RF (e.g., based on TX_RF) in a switchable coupling direction (e.g., a forward coupling signal), or a signal reflected by the antenna 140 and the antenna tuner 132 (e.g., a reverse coupling signal), as an RF feedback signal FB_RF. For example, as shown in FIG. 1, the coupler 131 may be referred to as a bidirectional coupler. When forward coupling F is set, the coupler 131 provides the signal coupled to the RF transmission signal TX_RF as the RF feedback signal FB_RF to the feedback circuit 150. When reverse coupling R is set, the coupler 131 provides the reflected signal as the RF feedback signal FB_RF to the feedback circuit 150. In an embodiment, a coupling direction of the coupler 131 is set based on a front-end control signal C_FE provided by a controller 117. For example, the coupler 131 may be configured to selectively provide the feedback signal FB_RF as a portion of one of a signal from the antenna 132 and a signal from the transceiver 120 to the feedback circuit 150 based on a logic state of the front-end control signal C_FE. For example, the coupler 131 may provide a portion of the signal from the antenna tuner 132 to the feedback circuit 150 when the front-end control signal C_FE has a logic low state and provide a portion of the signal from the transceiver 120 to the feedback circuit 150 when the front-end control signal C_FE has a logic high state. The antenna tuner 132 may have a variable impedance according to the front-end control signal C_FE, and accordingly, respective impedances of the antenna 140 and the antenna tuner 132 may be controlled. The controller 117 may transmit an antenna tuning signal to the antenna tuner 132 that indicates an impedance the antenna tuner 132 is to adjust the antenna 140. Thus, instead of using the same signal for changing the coupling direction and for adjusting the impedance, one signal may be used for changing the coupling direction and another signal may be used for adjusting the impedance. According to an exemplary embodiments, the antenna tuner 132 includes an impedance tuner, and an aperture tuner integrally formed with the antenna 140. In this disclosure, the respective impedances or respective reflection coefficients of the antenna 140 and the antenna tuner 132 may be simply referred to as an impedance or reflection coefficient of the antenna 140.

The transceiver 120 includes a transmitter 121, a receiver 122, and a switch 123. The transmitter 121 may generate the RF transmission signal TX_RF by processing a baseband transmission signal TX_BB received from the signal processor 110. For example, the transmitter 121 may include a filter, a mixer, and a power amplifier. The receiver 122 may generate a baseband reception signal RX_BB by processing an RF reception signal RX_RF received from the switch 123. For example, the receiver 122 may include a filter, a mixer, and a low noise amplifier. Example of the filter include a bandpass filter, a low pass filter and a high pass filter. The mixer may also be referred to as a frequency mixer. The mixer may be used to create a new signal from two signals applied to the mixer. The power amplifier may be implemented by an amplifier that is designed to increase power available to a load. The low noise amplifier may be implemented by an electronic amplifier that amplifies a very low-power signal without significantly degrading its signal to noise ration. In this disclosure, the RF reception signal RX_RF and the baseband reception signal RX_BB may be collectively referred to as a reception signal. The switch 123 provides the RF transmission signal TX_RF to the front-end circuit 130 in the transmission mode and provides a signal received via the coupler 131 as the RF reception signal RX_RF to the receiver 122 in a reception mode. According to some embodiments, the switch 123 may be replaced by a duplexer and/or a switchplexer. According to some embodiments, the switch 123 may include a duplexer and/or a switchplexer. In an embodiment, the duplexer is implemented by an electronic device that allows bi-directional communication over a single path.

The feedback circuit 150 receives the RF feedback signal FB_RF from the coupler 131 and generates a baseband feedback signal FB_BB by processing the RF feedback signal FB_RF. For example, the feedback circuit 150 may include a filter and a mixer, as will be described later with reference to FIG. 5. In this disclosure, the RF feedback signal FB_RF and the baseband feedback signal FB_BB may be collectively referred to as a feedback signal. According to an exemplary embodiment, the feedback circuit 150 generates a baseband feedback signal FB_BB having a narrow frequency band that is determined according to a target frequency band set by the controller 117.

The local oscillator 160 generates a first oscillation signal LO1 that is provided to the transceiver 120 and a second oscillation signal LO2 that is provided to the feedback circuit 150. For example, the local oscillator 160 may generate first and second oscillation signals LO1 and LO2 respectively having frequencies determined according to an oscillator control signal C_LO provided by the controller 117. For example, the local oscillator 160 may include at least one of a phased locked loop (PLL), a delayed locked loop (DLL), or a crystal oscillator. The first oscillation signal LO1 may be provided to a mixer included in the transmitter 121 or a mixer included in the receiver 122 and may have a frequency that is consistent with a carrier frequency. According to an exemplary embodiment, the local oscillator 160 provides a plurality of oscillation signals to the transceiver 120. The second oscillation signal LO2 may be provided to a mixer included in the feedback circuit 150, and a frequency band of the RF feedback signal FB_RF may shift according to the frequency of the second oscillation signal LO2.

The signal processor 110 includes a digital mixer 115, a digital filter 116, and the controller 117, and the digital mixer 115 and the digital filter 116 may be referred to as a digital signal processor (DSP). As will be described later, the digital mixer 115, the digital filter 116, and the controller 117 may be used to measure the reflection coefficient of the antenna 140. In this disclosure, the signal processor 110 may be referred to as a signal processing device for measuring the reflection coefficient of the antenna 140. The components included in the signal processor 110 may be implemented as a dedicated hardware block designed through logic synthesis, or may be implemented as a processing unit including at least one processor and a software block executed by the at least one processor, or may be implemented as a combination of the dedicated hardware block and the processing unit.

In an exemplary embodiment, the digital mixer 115 shifts the frequency band of a digital signal. For example, to measure the reflection coefficient of the antenna 140, the digital mixer 115 may shift respective frequency bands of a digital signal corresponding to the baseband transmission signal TX_BB (may be referred to as a first digital signal) and a digital signal corresponding to the baseband feedback signal FB_BB (may be referred to as a second digital signal). As described above, the baseband feedback signal FB_BB may be generated from the baseband transmission signal TX_BB by the transmitter 121, the coupler 131, and the feedback circuit 150, and accordingly, a location of a specific frequency component in the frequency spectrum of the baseband transmission signal TX_BB may be changed in the baseband feedback signal FB_BB. Thus, according to an exemplary embodiment, the digital mixer 115 aligns the locations of the respective frequency bands of the first and second digital signals.

The digital filter 116 may filter the digital signals to have a target frequency band. For example, the digital filter 116 may have a pass band having the same width as the target frequency band and may generate digital signals commonly having the target frequency band by filtering the digital signals respectively having frequency bands shifted by the digital mixer 115. As will be described later, the target frequency band may be set by the controller 117. According to an exemplary embodiment, the digital filter 116 includes a variable pass band under the control of the controller 117.

The controller 117 may set the target frequency band. In an embodiment, the controller 117 calculates the reflection coefficient of the antenna 140, based on a transmission signal and a feedback signal each having the target frequency band. 5G New Radio (5G NR), as an example of the wireless communication system to which the wireless communication equipment 100 is connectable, prescribes a bandwidth of 100 Mz in Frequency Range 1 (FR1) and prescribes a bandwidth of 400 Mz in Frequency Range 2 (FR2). 5G NR also prescribes a bandwidth of 400 MHz in FR1 and prescribes a bandwidth of 1.2 GHz in FR2, for carrier aggregation (CA). Processing this wide bandwidth in order to measure the reflection coefficient of the antenna 140 may be expensive. For example, blocks of the receiver 122 and the signal processor 110 that process the baseband reception signal RX_BB may be expensive to manufacture, have a large area, or consume a large amount of power. On the other hand, as described above, the reflection coefficient of the antenna 140 may be measured in the target frequency band set by the controller 117, and accordingly, costs for measuring the reflection coefficient of the antenna 140 may be significantly reduced. Because the reflection coefficient of the antenna 140 may be measured frequency-selectively, a frequency band that requires improvement may be selectively improved via antenna tuning. Consequently, the quality of wireless communication provided by the wireless communication equipment 100 may be improved due to the finely-tuned antenna 140.

According to some embodiments of the inventive concept, the controller 117 may detect an external object near the wireless communication equipment 100 (or the antenna 140), for example, a user of the wireless communication equipment 100 or another object, based on a reflection coefficient of the antenna 140 measured in the target frequency band. For example, a frequency band in which the reflection coefficient of the antenna 140 varies may differ according to the type of an external object, and the controller 117 may set a target frequency band according to the type of an external object that is to be detected and may measure the reflection coefficient of the antenna 140 in the target frequency band. The controller 117 may compare the measured reflection coefficient of the antenna 140 with a designed reflection coefficient of the antenna 140 and may detect an external object near the antenna 140, based on a result of the comparison. When an external object is detected by the controller 117, an operation for reducing a specific absorption ratio (SAR) for the external object, for example, a change in the direction of a beam, may be performed. For example, if antenna 140 includes two antenna oriented differently to transmit signals in different directions, one of the antennas is actively transmitting, and an external object is detected near the one antenna, the system 100 can direct that the one antenna stop transmitting and the other antenna start transmitting. For example, if the antenna 140 is rotatable, and an external object is detected near the antenna, the system 100 can rotate the antenna 140 to a different angle.

The controller 117 may control other components to measure the reflection coefficient of the antenna 140 in the target frequency band. According to some embodiments, the controller 117 may generate the oscillation control signal C_LO, based on the target frequency band and may control, for example, a frequency shift of the digital mixer 115 and a pass band of the digital filter 116. The controller 117 may also control the antenna tuner 132 via the front-end control signal C_FE, based on the measured reflection coefficient of the antenna 140.

Figure 2:
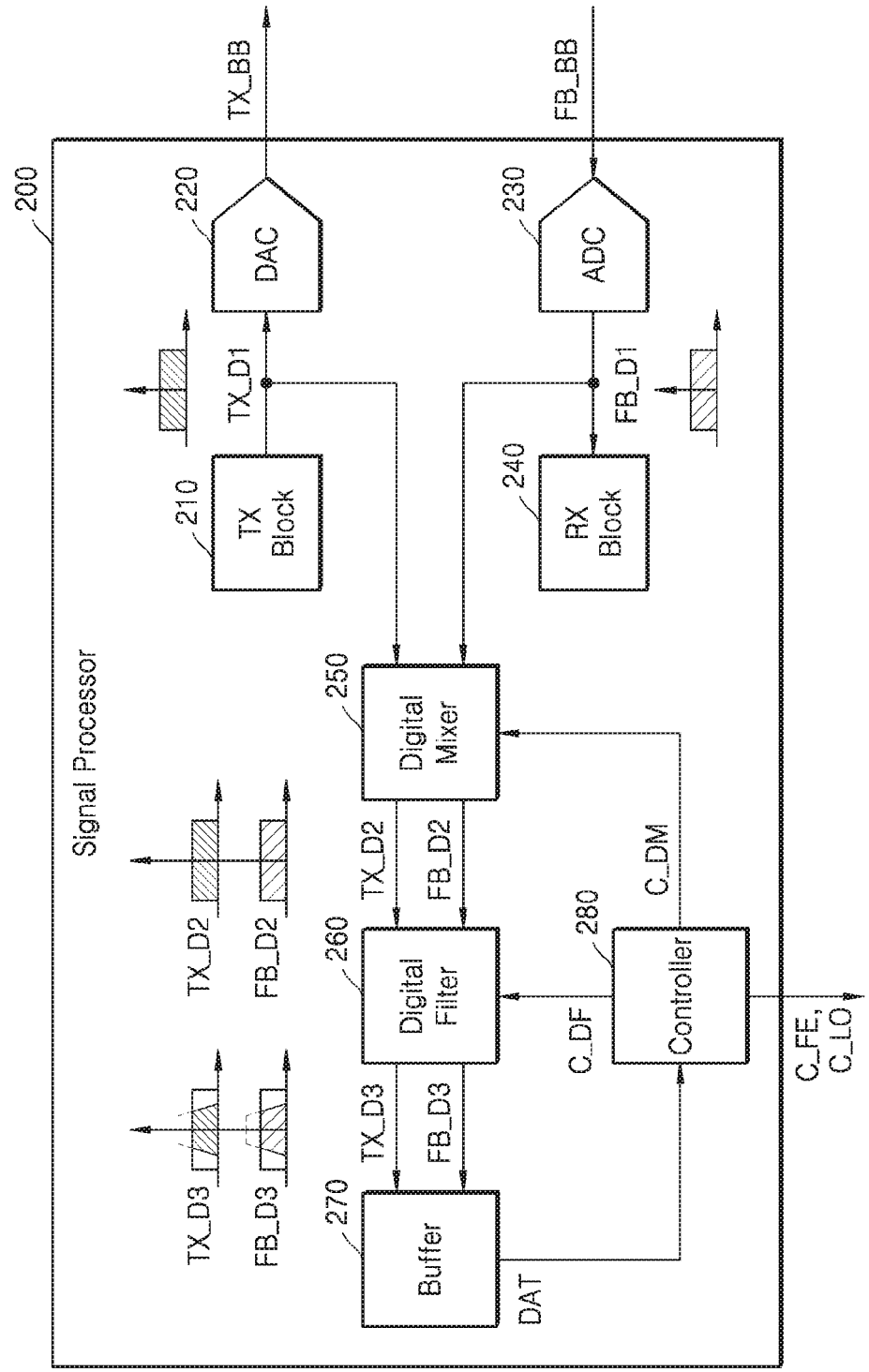
FIG. 2 is a block diagram of a signal processor according to an exemplary embodiment of the inventive concept.

FIG. 2 is a block diagram of a signal processor 200 according to an exemplary embodiment of the inventive concept, which may be used to implement the signal processor 110 of FIG. 1. FIG. 2 schematically illustrates frequency spectra of internal signals of the signal processor 200. As described above with reference to FIG. 1, the signal processor 200 of FIG. 2 may provide the transceiver 120 with the baseband transmission signal TX_BB and may receive the baseband reception signal RX_BB from the transceiver 120. As shown in FIG. 2, the signal processor 200 includes a TX block 210, a digital-to-analog converter (DAC) 220, an analog-to-digital converter (ADC) 230, an RX block 240, a digital mixer 250, a digital filter 260, a buffer 270, and a controller 280 (e.g., a control circuit). According to an exemplary embodiment, the components included in the signal processor 200 are included in a single semiconductor package. According to an exemplary embodiment, the components included in the signal processor 200 are included in each of two or more semiconductor packages. FIG. 2 will now be described with reference to FIG. 1.

The TX block 210 provides a first digital transmission signal TX_D1 (or a first digital signal) to the DAC 220. According to some embodiments, the TX block 210 may include an encoder, a modulator, and a filter to generate a signal including information that is to be transmitted to other wireless communication equipment via the antenna 140 and may generate the first digital transmission signal TX_D1 as a digital signal corresponding to the baseband transmission signal TX_BB. The DAC 220 generates the baseband transmission signal TX_BB, being an analog signal, by converting the first digital transmission signal TX_D1 to the analog signal. In this disclosure, the first digital transmission signal TX_D1 and signals generated therefrom, namely, the baseband transmission signal TX_BB, a second digital transmission signal TX_D2, a third digital transmission signal TX_D3, and the RF transmission signal TX_RF of FIG. 1, may be collectively referred to as a transmission signal.

The ADC 230 receives the baseband feedback signal FB_BB being an analog signal and generates a first digital feedback signal FB_D1 (or a second digital signal) by converting the baseband feedback signal FB_BB to a digital signal. The wireless communication equipment 100 of FIG. 1 may be set to a transmission mode, a reception mode, or an antenna tuning mode. According to an exemplary embodiment of the inventive concept, the ADC 230 converts the baseband reception signal RX_BB in the reception mode and converts the baseband feedback signal FB_BB in the antenna tuning mode. According to some embodiments, as will be described later with reference to FIG. 6, the ADC 230 may perform conversions at different sampling rates in the reception mode and the antenna tuning mode. The RX block 240 may receive a digital signal generated when the ADC 230 converts the baseband reception signal RX_BB in the reception mode and may include a decoder, a demodulator, and a filter to extract information from the received digital signal. According to an exemplary embodiment, the RX block 240 omits processing of the first digital feedback signal FB_D1 in the antenna tuning mode. According to an exemplary embodiment, the signal processor 200 includes an independent ADC that is different from the ADC 230 of FIG. 2 connected with the RX block 240 and generates the first digital feedback signal FB_D1 by converting the baseband feedback signal FB_BB. In this disclosure, the RF feedback signal FB_RF of FIG. 1 and signals generated therefrom, namely, the baseband feedback signal FB_BB, the first digital feedback signal FB_D1, a second digital feedback signal FB_D2, and a third digital feedback signal FB_D3, may be collectively referred to as a feedback signal.

The digital mixer 250 receives the first digital transmission signal TX_D1 and the first digital feedback signal FB_D1 and may also receive a mixer control signal C_DM from the controller 280. The digital mixer 250 may generate the second digital transmission signal TX_D2 and the second digital feedback signal FB_D2 by shifting frequency bands of the first digital transmission signal TX_D1 and/or the first digital feedback signal FB_D1, based on the mixer control signal C_DM. For example, as described above with reference to FIG. 1, a location of a specific frequency component in the frequency spectrum of the baseband transmission signal TX_BB may be changed in the baseband feedback signal FB_BB, and the controller 280 may generate the mixer control signal C_DM such that the frequency band of the first digital transmission signal TX_D1 corresponds to that of the first digital feedback signal FB_D1. Accordingly, referring to FIG. 2, the digital mixer 250 may generate the second digital transmission signal TX_D2 and the second digital feedback signal FB_D2 respectively having aligned frequency bands in a frequency domain.

The digital filter 260 may generate the third digital transmission signal TX_D3 and the third digital feedback signal FB_D3 by filtering the second digital transmission signal TX_D2 and/or the second digital feedback signal FB_D2 received from the digital mixer 250. The digital filter 260 may filter the second digital transmission signal TX_D2 and the second digital feedback signal FB_D2 such that the third digital transmission signal TX_D3 and the third digital feedback signal FB_D3 have respective target frequency bands. For example, the digital filter 260, as a low pass filter (LPF), may have a pass band corresponding to the target frequency band, and accordingly, as shown by a dashed line of FIG. 2, may generate the third digital transmission signal TX_D3 and the third digital feedback signal FB_D3 by passing (or removing) at least some of the frequency bands of the second digital transmission signal TX_D2 and the second digital feedback signal FB_D2. According to some embodiments, the digital filter 260 may receive a filter control signal C_DF from the controller 280, and a pass band of the digital filter 260 may be controlled based on the filter control signal C_DF.

The buffer 270 may capture the third digital transmission signal TX_D3 and the third digital feedback signal FB_D3. For example, the buffer 270 may include a memory and may store data DAT in the memory by capturing the third digital transmission signal TX_D3 and the third digital feedback signal FB_D3. Like the frequency bands of the third digital transmission signal TX_D3 and the third digital feedback signal FB_D3 of FIG. 2, the target frequency band may be narrower than the frequency band of the baseband transmission signal TX_BB (or the first digital transmission signal TX_D1), and accordingly, the sampling rate of the ADC 230 may be reduced and the size of the data DAT stored in the buffer 270 may also decrease. Thus, costs for not only the digital mixer 250 and the digital filter 260 but also the buffer 270, for example, an area and power consumption, may be reduced.

The controller 280 may set the target frequency band and may generate the mixer control signal C_DM, the filter control signal C_DF, and the oscillator control signal C_LO, based on the set target frequency band. The controller 280 may obtain the data DAT from the buffer 270 and may calculate the reflection coefficient of the antenna 140 in the target frequency band, based on a transmission signal and a feedback signal both included in the data DAT. In an embodiment, the controller 280 generates the front-end control signal C_FE, based on the calculated reflection coefficient of the antenna 140. An illustration of an operation of the controller 280 will be described later with reference to FIG. 9.

Figure 3:
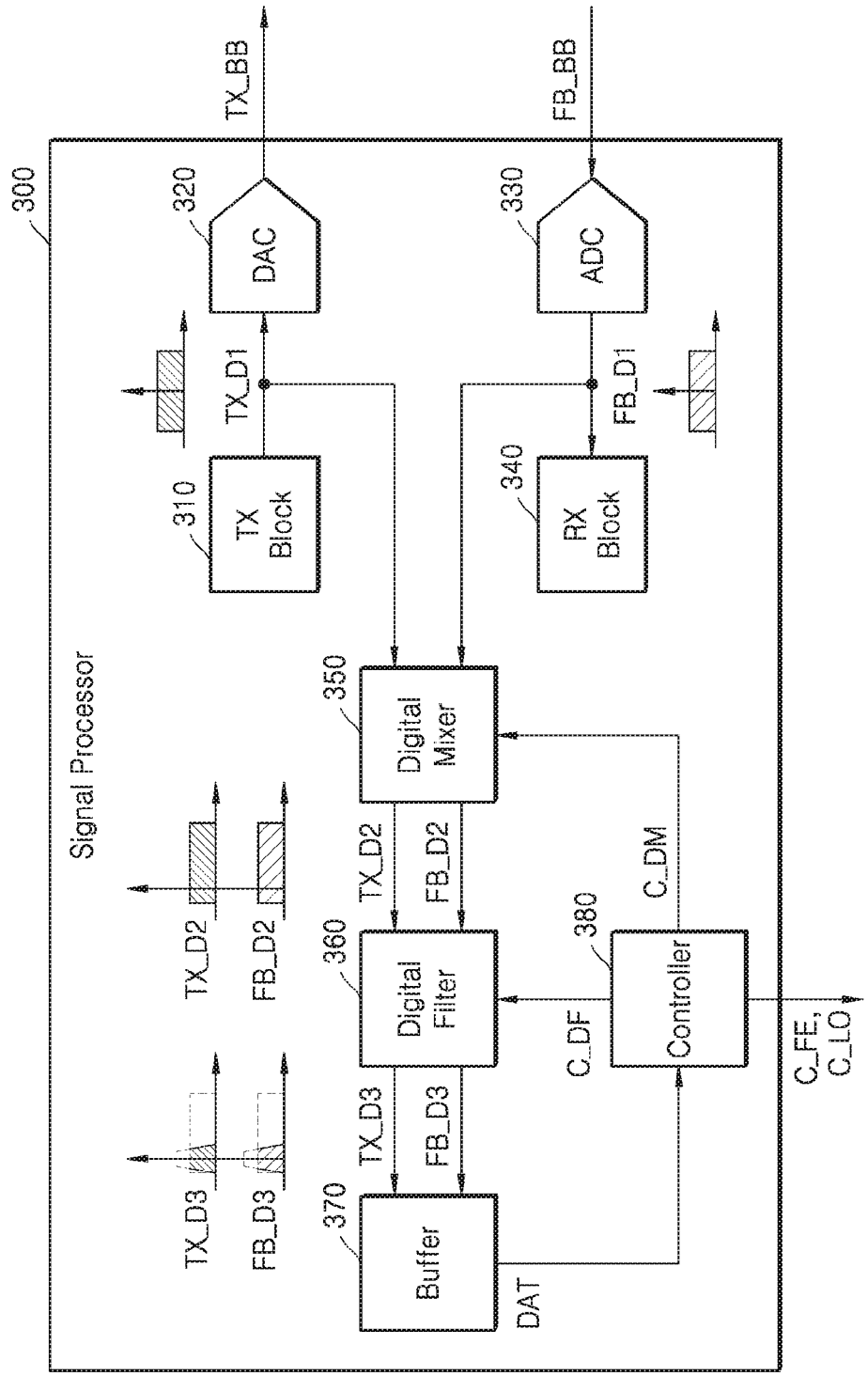
FIG. 3 is a block diagram of a signal processor according to an exemplary embodiment of the inventive concept.

FIG. 3 is a block diagram of a signal processor 300 according to an exemplary embodiment of the inventive concept, which may be used to implement the signal processor 110 of FIG. 1. FIG. 3 schematically illustrates frequency spectra of internal signals of the signal processor 300. Similar to the signal processor 200 of FIG. 2, the signal processor 300 of FIG. 3 includes a TX block 310, a DAC 320, an ADC 330, an RX block 340, a digital mixer 350, a digital filter 360, a buffer 370, and a controller 380. FIG. 3 will now be described with reference to FIG. 1, and a description of FIG. 3 that is the same as given above with reference to FIG. 2 will not be repeated herein.

The controller 380 may set, as the target frequency band, a specific frequency range in the overall bandwidth of the baseband transmission signal TX_BB and may control the digital mixer 350 and the digital filter 360 in order to obtain a transmission signal and a feedback signal in the target frequency band. According to an exemplary embodiment, the digital mixer 350 aligns the frequency bands of the first digital transmission signal TX_D1 and the first digital feedback signal FB_D1, and also shifts the frequency bands of the first digital transmission signal TX_D1 and the first digital feedback signal FB_D1 such that the target frequency band corresponds to a pass band of the digital filter 360. For example, as shown in FIG. 3, a portion of the frequency band of the first digital transmission signal TX_D1 that corresponds to a low frequency may be set as the target frequency band, and the digital mixer 350 may generate the second digital transmission signal TX_D2 and the second digital feedback signal FB_D2 having respective frequency spectra as shown in FIG. 3, such that, based on the mixer control signal C_DM provided by the controller 380, the portion corresponding to the low frequency is positioned in the pass band of the digital filter 360. According to some embodiments, to measure the reflection coefficient of the antenna 140 in the overall bandwidth, the controller 380 may repeatedly measure the reflection coefficient of the antenna 140 while changing the target frequency band.

Figure 4:
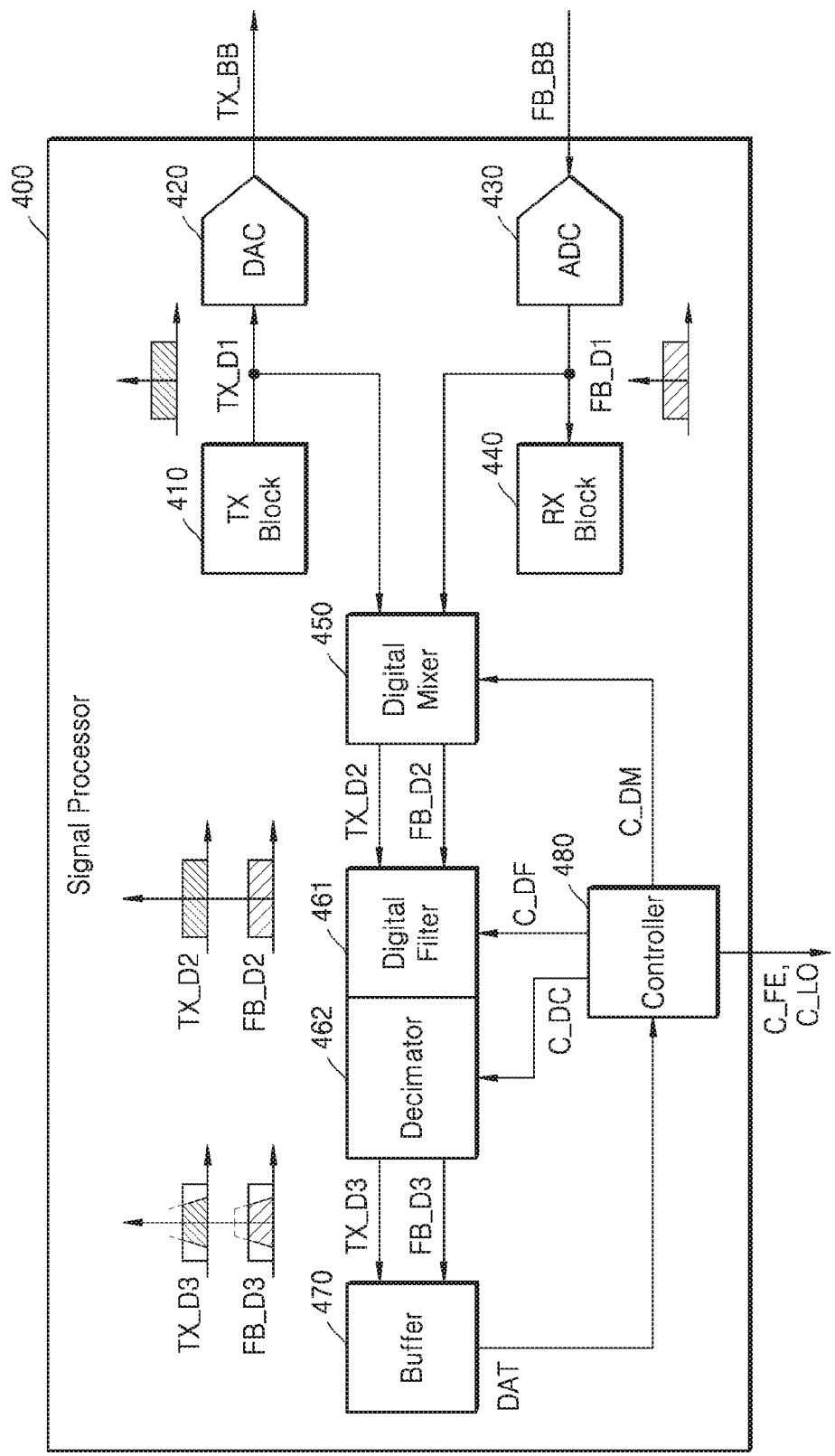
FIG. 4 is a block diagram of a signal processor according to an exemplary embodiment of the inventive concept.

FIG. 4 is a block diagram of a signal processor 400 according to an embodiment of the inventive concept, which may be used to implement the signal processor 110 of FIG. 3. FIG. 4 schematically illustrates frequency spectra of internal signals of the signal processor 400. Similar to the signal processor 200 of FIG. 2, the signal processor 400 of FIG. 4 includes a TX block 410, a DAC 420, an ADC 430, an RX block 440, a digital mixer 450, a digital filter 461, a buffer 470, and a controller 480. As shown in FIG. 4, the signal processor 400 further includes a decimator 462. FIG. 4 will now be described with reference to FIG. 1, and a description of FIG. 4 that is the same as given above with reference to FIG. 2 will not be repeated herein.

According to some embodiments, the decimator 462 may be referred to as a down-sampler and may down-sample signals obtained after the digital filter 461 filters the second digital transmission signal TX_D2 and the second digital feedback signal FB_D2. As described above, because the frequency bandwidths of the transmission signal and the feedback signal were reduced by the digital filter 461, the signals obtained via the filtering may not be distorted even when being down-sampled. Accordingly, the controller 480 may generate a decimation control signal C_DC, based on the target frequency band (or the pass band of the digital filter 461), and the decimator 462 may generate the third digital transmission signal TX_D3 and the third digital feedback signal FB_D3 by performing down-sampling, based on the decimation control signal C_DC. According to some embodiments, the decimator 462 down-samples the second digital transmission signal TX_D2 and the second digital feedback signal FB_D2 provided by the digital mixer 450 to generate down-sampled signals, and the down-sampled signals are filtered by the digital filter 461. The decimator 462 may also be referred to as a down sampler. When downsampling (decimation) is performed on a signal, it produces an approximation of the signal that would have been obtained by sampling the signal at a lower rate.

Figure 5:
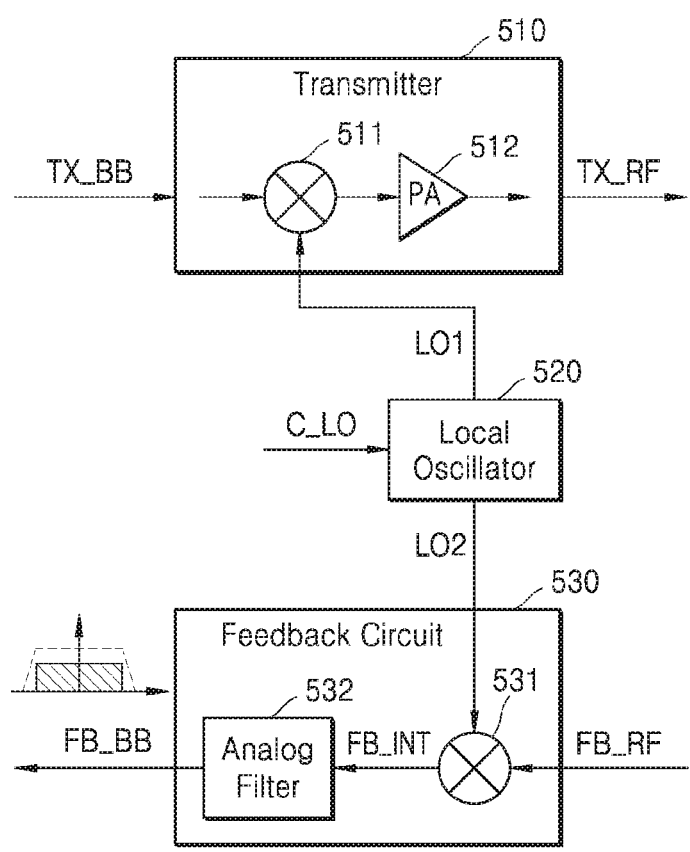
FIG. 5 is a block diagram of a feedback circuit according to an exemplary embodiment of the inventive concept.

FIG. 5 is a block diagram of a feedback circuit 530 according to an exemplary embodiment of the inventive concept. In detail, FIG. 5 illustrates a transmitter 510 and a local oscillator 520 together with the feedback circuit 530. FIG. 5 will now be described with reference to FIG. 1.

As described above with reference to FIG. 1, the transmitter 510 receives the baseband transmission signal TX_BB from the signal processor 110 of FIG. 1 and generates the RF transmission signal TX_RF. As shown in FIG. 5, the transmitter 510 includes a TX mixer 511 and a power amplifier 512, and may further include an additional component not shown in FIG. 5 (for example, a filter). A first oscillation signal LO1 provided by the local oscillator 520 may have a carrier frequency, and the TX mixer 511 may perform up-conversion according to a frequency of the first oscillation signal LO1. The power amplifier 512 may amplify an output signal of the TX mixer 511. The up-conversion may increase the frequency of the basedband transmission signal TX_BB.

As described above with reference to FIG. 1, the local oscillator 520 may receive the oscillator control signal C_LO from the controller 117 of FIG. 1 and may provide the first oscillation signal LO1 to the transmitter 510 and a second oscillation signal LO2 to the feedback circuit 530. The local oscillator 520 may generate the first oscillation signal LO1 and the second oscillation signal LO2 respectively having frequencies determined according to the oscillator control signal C_LO. According to an exemplary embodiment, the first oscillation signal LO1 and the second oscillation signal LO2 have the same frequency.

As described above with reference to FIG. 1, the feedback circuit 530 may receive the RF feedback signal FB_RF from the coupler 131 of FIG. 1, may receive the second oscillation signal LO2 from the local oscillator 520, and may generate the baseband feedback signal FB_BB. As shown in FIG. 5, the feedback circuit 530 includes an analog mixer 531 and an analog filter 532. According to some embodiments, the feedback circuit 530 may further include an additional component (for example, an amplifier) in a path where the baseband feedback signal FB_BB is generated from the RF feedback signal FB_RF.

The analog mixer 531 receives the RF feedback signal FB_RF and receives the second oscillation signal LO2 from the local oscillator 520. The analog mixer 531 may generate an internal feedback signal FB_INT by down-converting the RF feedback signal FB_RF according to the frequency of the second oscillation signal LO2. The down-converting may reduce the frequency of the RF feedback signal FB_RF. According to some embodiments, the controller 117 may generate the oscillator control signal C_LO such that the second oscillation signal LO2 has a frequency that is identical with the frequency of the first oscillation signal LO1 provided by the transmitter 510, namely, the carrier frequency. Accordingly, the internal feedback signal FB_INT may have a frequency band shifted to a baseband.

The analog filter 532, as an LPF, may generate the baseband feedback signal FB_BB by filtering the internal feedback signal FB_INT. For example, a pass band of the analog filter 532 shown by dashed line of FIG. 5 may have a width that is equal to or greater than the width of the target frequency band. According to an exemplary embodiment, the pass band of the analog filter 532 has a narrower width than a maximum frequency bandwidth of the baseband transmission signal TX_BB. According to an exemplary embodiment, the analog filter 532 has a pass band that depends on a sampling rate that is used when an ADC (for example, the ADC 230 of FIG. 2) converts the baseband feedback signal FB_BB into a digital signal (for example, FB_D of FIG. 2). For example, the pass band of the analog filter 532 may have a width that is less than or equal to a half of a sampling frequency that is used when the baseband feedback signal FB_BB is converted into the digital signal. Consequently, the baseband feedback signal FB_BB may have a narrow bandwidth due to the analog filter 532, and accordingly, costs for processing the baseband feedback signal FB_BB may be reduced.

Figure 6:
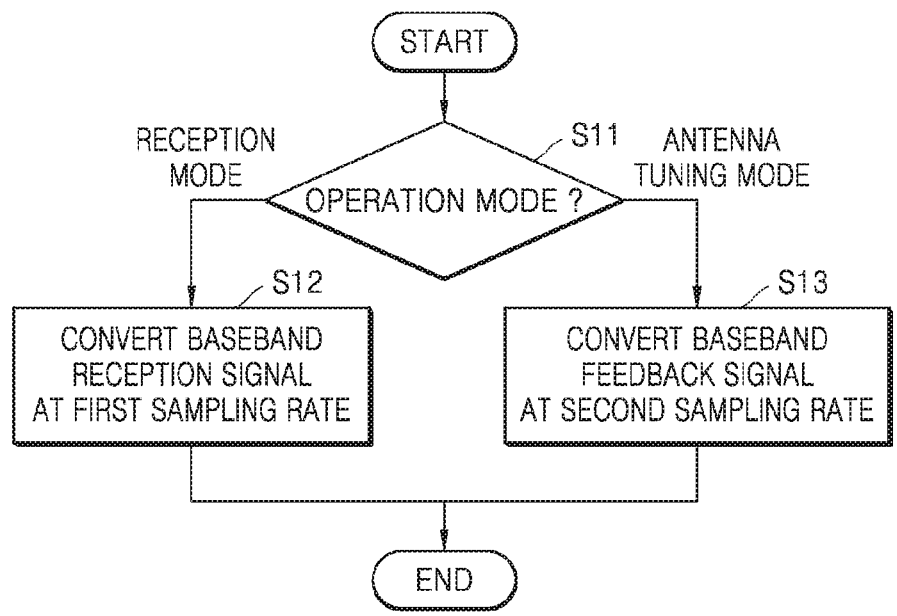
FIG. 6 is a flowchart of an operation of an analog-to-digital converter (ADC), according to an exemplary embodiment of the inventive concept.

FIG. 6 is a flowchart of an operation of an ADC, according to an exemplary embodiment of the inventive concept. In detail, FIG. 6 illustrates an operation of the ADC 230 of FIG. 2. As described above with reference to FIG. 2, the ADC 230 may convert the baseband reception signal RX_BB of FIG. 1 in the reception mode and may convert the baseband feedback signal FB_BB in the antenna tuning mode. FIG. 6 will now be described with reference to FIG. 2.

In operation S11, an operation mode is determined. For example, the controller 280 may determine the operation mode to be one of a transmission mode, a reception mode, and an antenna tuning mode. As described above, the ADC 230 may be used in the reception mode and the antenna tuning mode. As shown in FIG. 6, when the reception mode is determined as the operation mode, operation S12 is performed, and, when the antenna tuning mode is determined as the operation mode, operation S13 is performed.

When the reception mode is determined as the operation mode, the baseband reception signal RX_BB is converted at a first sampling rate, in operation S12. When the wireless communication equipment 100 of FIG. 1 connects to a wireless communication system using a broadband channel, the frequency band of the baseband reception signal RX_BB may have a wide band, and accordingly, the ADC 230 may convert the baseband reception signal RX_BB at a first sampling rate that is relatively high, for example, higher than a second sampling rate.

When the antenna tuning mode is determined as the operation mode, the baseband feedback signal FB_BB is converted at the second sampling rate, in operation S13. As described above with reference to the drawings, the reflection coefficient of the antenna 140 may be measured in the target frequency band, and the baseband feedback signal FB_BB may be converted at the second sampling rate, which is relatively low, for example, lower than the first sampling rate, due to the bandwidth of the target frequency band. Accordingly, as described above with reference to FIG. 5, the pass band of the analog filter 532 included in the feedback circuit 530 may be determined based on the second sampling rate.

Figure 7:
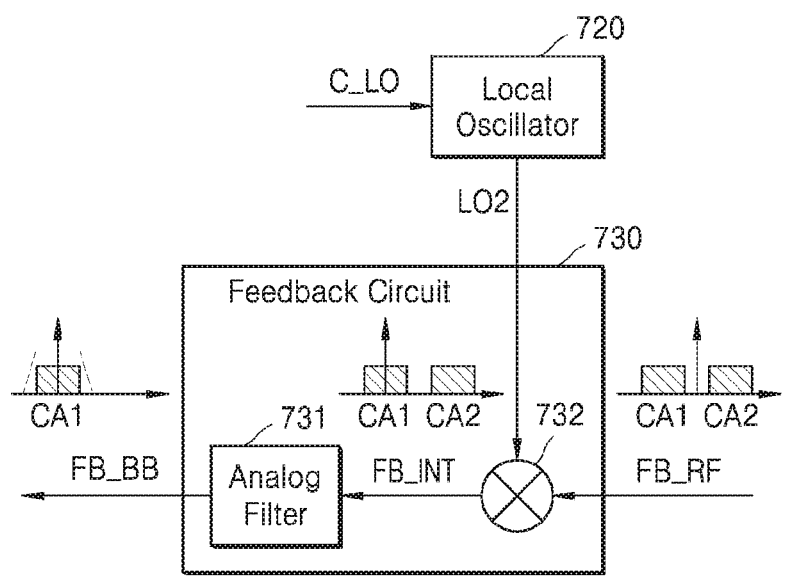
FIG. 7 is a block diagram of a feedback circuit according to an exemplary embodiment of the inventive concept.

FIG. 7 is a block diagram of a feedback circuit 730 according to an exemplary embodiment of the inventive concept, which may be used to implement the feedback circuit 150 of FIG. 1. In detail, FIG. 7 illustrates a local oscillator 720 together with the feedback circuit 730. FIG. 7 will now be described with reference to FIG. 1, and a description of FIG. 7 that is the same as given above with reference to FIG. 5 will not be repeated herein.

The wireless communication equipment 100 may connect to a wireless communication system using CA, and accordingly, may perform transmission and reception by using a plurality of component carriers (CCs). For example, as shown in FIG. 7, the RF feedback signal FB_RF provided by the coupler 131 of FIG. 1 may include a first frequency band CA1 and a second frequency band CA2 respectively corresponding to different CCs. The controller 117 may set the first frequency band CA1 as the target frequency band and may control shift of a frequency band, namely, the first frequency band CA1 and the second frequency band CA2, of the RF feedback signal FB_RF via the oscillator control signal C_LO to generate the baseband feedback signal FB_BB including the first frequency band CA1. According to an exemplary embodiment, the controller 117 generates the oscillator control signal C_LO so that a second oscillation signal LO2 having the same frequency as one of the plurality of CCs in CA is generated.

The local oscillator 720 provides the feedback circuit 730 with a second oscillation signal LO2 having a frequency determined according to the oscillator control signal C_LO. For example, as shown in FIG. 7, the second oscillation signal LO2 may have the same frequency as the frequency of a CC corresponding to the first frequency band CA1 such that the first frequency band CA1 overlaps the pass band of the analog filter 731 indicated by a dashed line of FIG. 7. Illustration of an operation of the signal processor 110 for processing the baseband feedback signal FB_BB of FIG. 7 will be described below with reference to FIG. 8.

Figure 8:
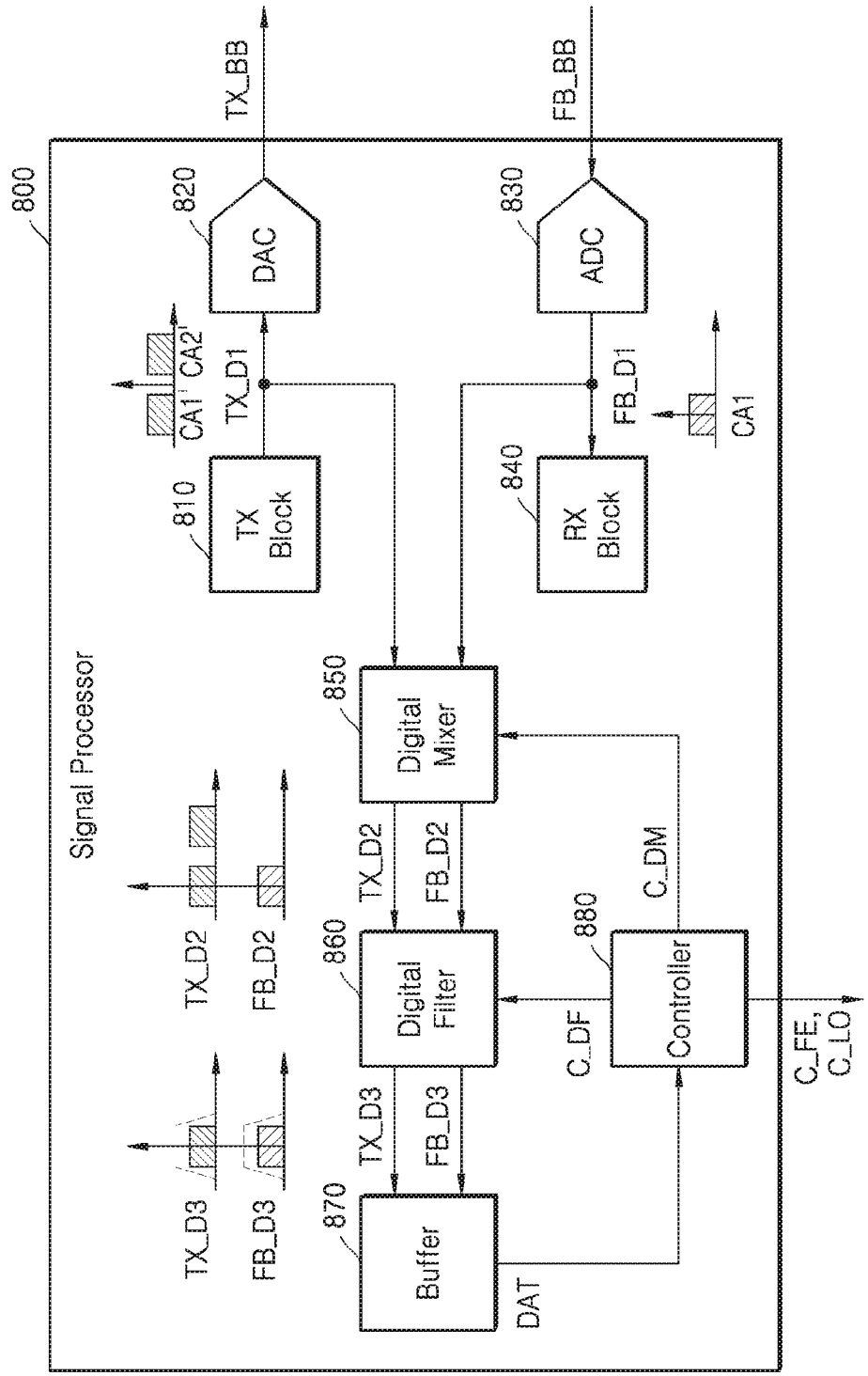
FIG. 8 is a block diagram of a signal processor according to an exemplary embodiment of the inventive concept.

FIG. 8 is a block diagram of a signal processor 800 according to an exemplary embodiment of the inventive concept, which may be used to implement the signal processor 110 of FIG. 1. FIG. 8 schematically illustrates frequency spectra of internal signals of the signal processor 800. Similar to the signal processor 200 of FIG. 2, the signal processor 800 of FIG. 8 includes a TX block 810, a DAC 820, an ADC 830, an RX block 840, a digital mixer 850, a digital filter 860, a buffer 870, and a controller 880. FIG. 8 will now be described with reference to FIGS. 1 and 7, and a description of FIG. 8 that is the same as given above with reference to FIG. 2 will not be repeated herein.

The baseband transmission signal TX_BB (or the first digital transmission signal TX_D1) may have a first frequency band CA1' and a second frequency band CA2', due to CA. As described above with reference to FIG. 7, the baseband feedback signal FB_BB (or the first digital feedback signal FB_D1) may have the first frequency band CA1 corresponding to the target frequency band.

To align the frequency band of the first digital transmission signal TX_D1 with the frequency band of the first digital feedback signal FB_D1, the digital mixer 850 may differently move the frequency band of the first digital transmission signal TX_D1 and the frequency band of the first digital feedback signal FB_D1, based on the mixer control signal C_DM. For example, as shown in FIG. 8, the digital mixer 850 generates the second digital feedback signal FB_D2 having a similar frequency band to the frequency band of the first digital feedback signal FB_D1 and generates the second digital transmission signal TX_D2 by moving the frequency band of the first digital transmission signal TX_D1 such that the first frequency band CA1' of the first digital transmission signal TX_D1 overlaps with the pass band of the digital filter 860. Next, the digital filter 860 generates the third digital transmission signal TX_D3 and the third digital feedback signal FB_D3 by passing only a frequency band corresponding to the target frequency band.

FIG. 9 is a flowchart of a method of measuring the reflection coefficient of an antenna, according to an exemplary embodiment of the inventive concept; According to some embodiments, the method of FIG. 9 may be performed by the controller 117 of FIG. 1. FIG. 9 will now be described with reference to FIG. 1.

In operation S20, the coupler 131 is set in a first coupling direction. For example, the coupler 131 may be set to forward coupling, and accordingly, may provide, as the RF feedback signal FB_RF, a signal coupled to the RF transmission signal TX_RF to the feedback circuit 150. Alternately, the coupler 131 may be set to reverse coupling, and accordingly, may provide, as the RF feedback signal FB_RF, a signal reflected by the antenna 140 to the feedback circuit 150. The controller 117 may set the coupler 131 in the first coupling direction by using the front-end control signal C_FE.

In operation S30, a transmission signal and a feedback signal in the target frequency band are obtained. For example, as described above with reference to the drawings, the controller 117 may control the digital mixer 115 and the digital filter 116 included in the signal processor 110 to obtain the transmission signal and the feedback signal in the target frequency band. The controller 117 may also control the frequency of the second oscillation signal LO2 generated by the local oscillator 160 via the oscillator control signal C_LO. Accordingly, the controller 117 may obtain the transmission signal and the feedback signal in the target frequency band.

In operation S40, the coupler 131 is set in a second coupling direction. The second coupling direction in operation S40 is different from the first coupling direction in operation S20. For example, when the coupler 131 is set to forward coupling in operation S20, the coupler 131 is set to reverse coupling, in operation S40. On the other hand, when the coupler 131 is set to reverse coupling in operation S20, the coupler 131 is set to forward coupling, in operation S40. The controller 117 may set the coupler 131 in the second coupling direction by using the front-end control signal C_FE.

In operation S50, a transmission signal and a feedback signal in the target frequency band are obtained. For example, the controller 117 may control the digital mixer 115, the digital filter 116, and/or the local oscillator 160 in the same manner as in operation S30, and the transmission signal and the feedback signal in the target frequency band may be obtained.

In operation S60, the reflection coefficient of the antenna 140 is calculated. For example, the controller 117 calculates the reflection coefficient of the antenna 140, based on not only the transmission signal and the feedback signal obtained in operation S30 but also the transmission signal and the feedback signal obtained in operation S50. According to an exemplary embodiment, the controller 117 may estimate characteristics of a transmission path from the transmitter 121 to the coupler 131 and characteristics of a feedback path from the coupler 131 to the signal processor 110 via the feedback circuit 150, by using the transmission signal and the feedback signal obtained when the coupler 131 is set to forward coupling. For example, the controller 117 may estimate phase variations that occur in the transmission path and the feedback path. Next, the controller 117 may calculate the reflection coefficient of the antenna 140, based on the estimated respective characteristics of the transmission path and the feedback path and the transmission signal and the feedback signal obtained when the coupler 131 is set to reverse coupling. For example, when the estimated respective characteristics of the transmission path and the feedback path have been compensated for, a reflection coefficient Γ of the antenna 140 may be calculated using [Equation 1] below:

$$\Gamma = \frac{|r_{rev}|}{|r_{fwd}|} \cdot \exp\left(j(\angle r_{rev} - \angle r_{fwd})\right) \quad \text{[Equation 1]}$$

where $r_{fwd}$ indicates a signal obtained from a transmission signal, and $r_{rev}$ indicates a feedback signal obtained by the coupler 131 set to reverse coupling. Illustrations of an operation, performed by the controller 117, of tuning the antenna 140, based on the calculated reflection coefficient, will now be described with reference to FIGS. 10A through 10C.

Figure 10A:
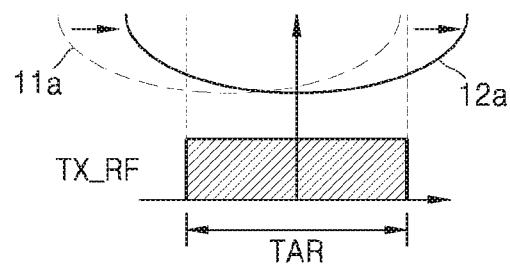
FIGS. 10A through 10C illustrate examples of an operation of tuning an antenna, according to exemplary embodiments of the inventive concept.
Figure 10B:
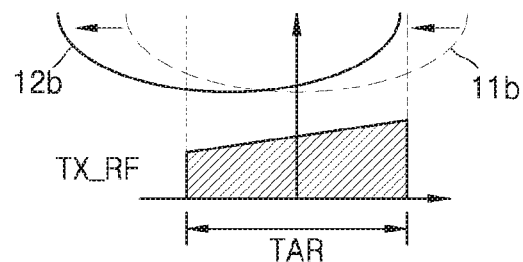
Figure 10C:
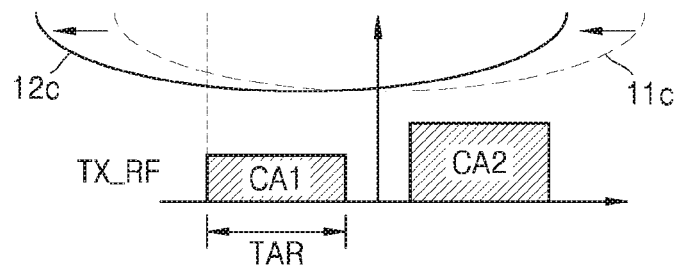

FIGS. 10A through 10C illustrate examples of an operation of tuning an antenna, according to embodiments of the inventive concept. In detail, FIGS. 10A through 10C illustrate an example of the RF transmission signal TX_RF of FIG. 1 and an example of the reflection coefficient of the antenna 140 in a frequency domain. As described above with reference to the drawings, the controller 117 of FIG. 1 may measure a reflection coefficient of the antenna 140 in the target frequency band, control the antenna tuner 132 via the front-end control signal C_FE, based on the measured reflection coefficient, and control the respective reflection coefficients of the antenna tuner 132 and the antenna 140. FIGS. 10A through 10C will now be described with reference to FIG. 1, and a description of FIGS. 10A through 10C that is the same as given above with reference to FIG. 1 will not be repeated herein.

Referring to FIG. 10A, the controller 117 controls the antenna tuner 132 such that the reflection coefficient of the antenna 140 is optimized in a target frequency band TAR. For example, as described above with reference to FIG. 2, the controller 117 may set the target frequency band TAR of FIG. 10A, and, when the reflection coefficient of the antenna 140 is measured as being in a first curve 11*a* in the target frequency band TAR, the controller 117 adjusts the reflection coefficient of the antenna 140 to be in a second curve 12*a*.

Referring to FIG. 10B, the controller 117 controls the antenna tuner 132 to optimize a specific frequency range in the overall bandwidth. In a wireless communication system having a bandwidth of 100 MHz or greater as in 5G NR, RF impairment may not uniformly occur in the overall bandwidth. Accordingly, as described above with reference to FIG. 3, the controller 117 may set a target frequency band TAR corresponding to a region requiring an improvement from among the overall bandwidth, and may measure a reflection coefficient of the antenna 140 corresponding to the target frequency band. For example, as described above with reference to FIG. 10B, the RF transmission signal TX_RF may have uneven frequency characteristics, and, when the reflection coefficient of the antenna 140 has been measured as being in a first curve 11*b* in the target frequency band TAR, the controller 117 compensates for RF impairment by adjusting the reflection coefficient of the antenna 140 to be in a second curve 12*b*.

Referring to FIG. 10C, the controller 117 controls the antenna tuner 132 to optimize some of a plurality of frequency bands corresponding to a plurality of CCs in CA. For example, as described above with reference to FIGS. 7 and 8, the controller 880 may set a target frequency band corresponding to a first frequency band CA1 of FIG. 10C and may measure the reflection coefficient of the antenna 140. When the reflection coefficient of the antenna 140 has been measured as being in a first curve 11*c* of FIG. 10C in the target frequency band TAR, the controller 117 may optimize a reflection coefficient for the first frequency band CA1 by adjusting the reflection coefficient of the antenna 140 to be in a second curve 12*c*.

Figure 11:
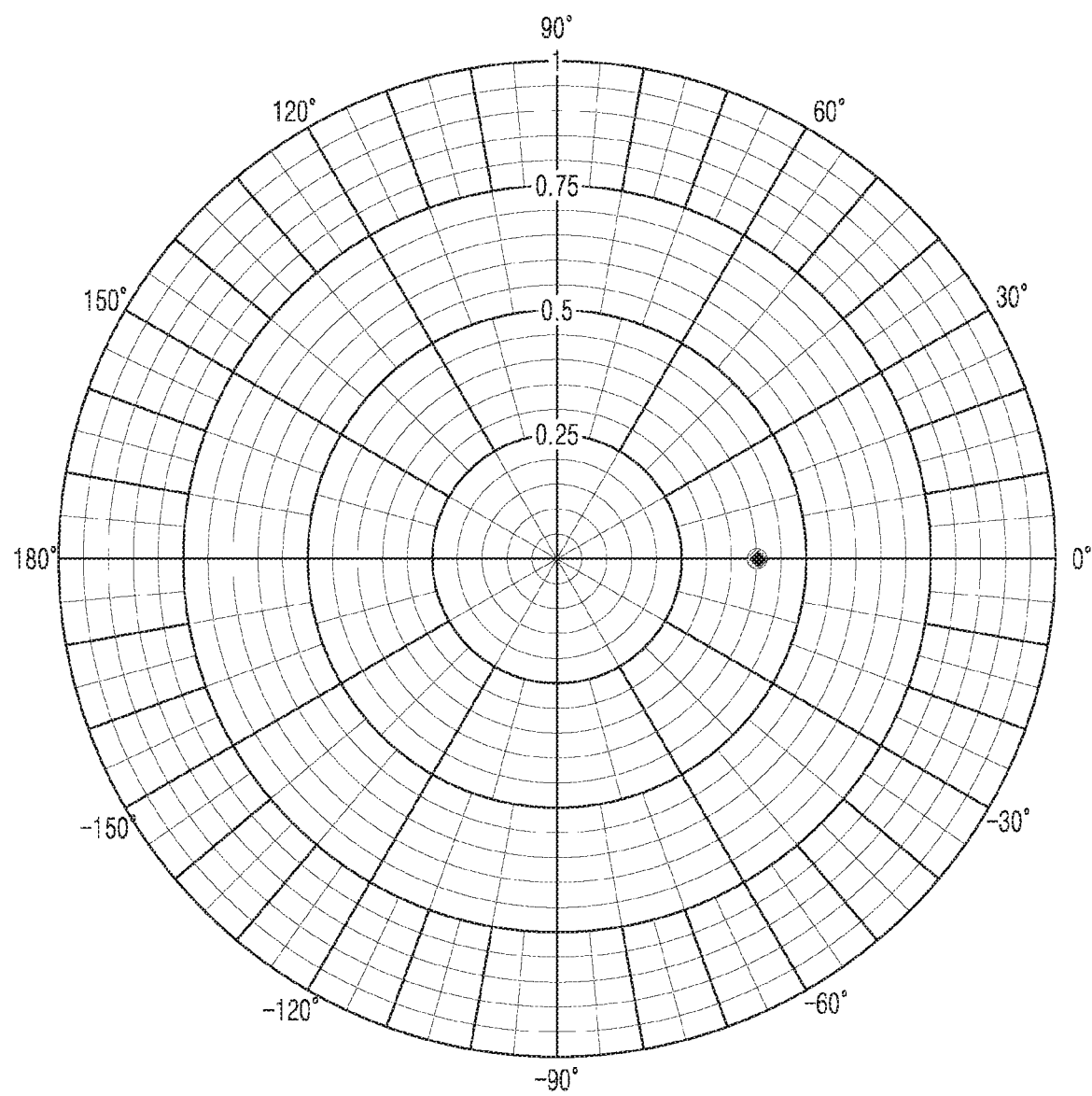
FIG. 11 illustrates reflection coefficients of an antenna measured according to an exemplary embodiment of the inventive concept.

FIG. 11 illustrates reflection coefficients of an antenna measured according to an exemplary embodiment of the inventive concept. In detail, FIG. 11 illustrates a result of a simulation performed using the above-described method of measuring the reflection coefficient of an antenna. As indicated by a circular marker of FIG. 11, the antenna may have a reflection coefficient having a size of 0.4 and a phase of 0°. When a reflection coefficient of the antenna is measured in a target frequency band corresponding to a center frequency 20 MHz within a 5G NR 100 MHz signal, the measured reflection coefficient of the antenna may be consistent with an actual reflection coefficient of the antenna, as indicated by a diamond marker of FIG. 11.

Figure 12:
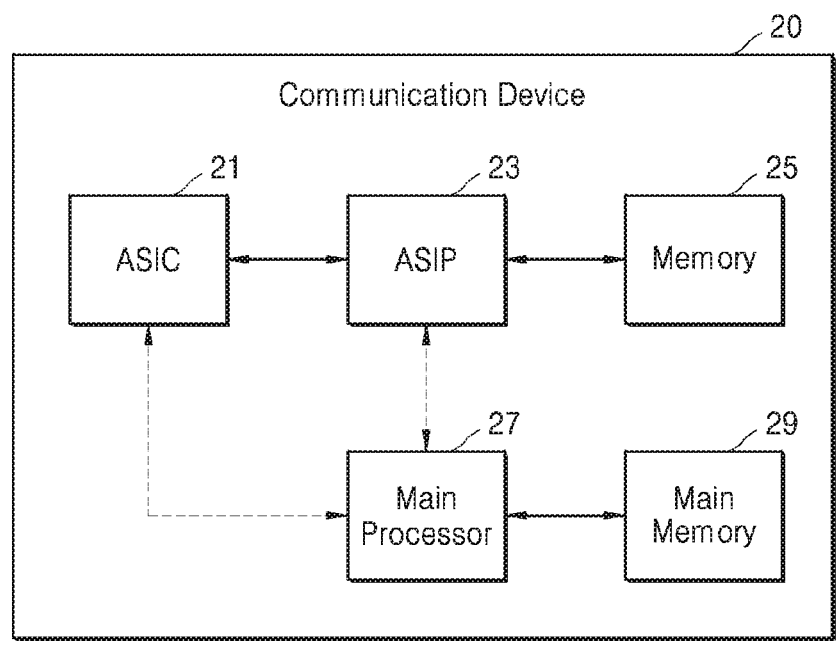
FIG. 12 is a block diagram of a communication device according to an exemplary embodiment of the inventive concept.

FIG. 12 is a block diagram of a communication device 20 according to an exemplary embodiment of the inventive concept. According to some embodiments, the communication device 20 may perform operations of at least some of the components included in the signal processor 110 of FIG. 1.

As shown in FIG. 12, the communication device 20 includes an Application Specific Integrated Circuit (ASIC) 21, an Application Specific Instruction set Processor (ASIP) 23, a memory 25, a main processor 27, and a main memory 29. At least two of the ASIC 21, the ASIP 23, and the main processor 27 may communicate with each other. At least two of the ASIC 21, the ASIP 23, the memory 25, the main processor 27, and the main memory 29 may be embedded into one chip.

The ASIP 23 may be an integrated circuit customized for a use purpose. The ASIP 23 may support an instruction set only for a certain application and may execute instructions included in the instruction set. The memory 25 may communicate with the ASIP 23 and may store, as a non-transitory storage, the instructions executed by the ASIP 23. For example, as a non-limiting example, the memory 25 may include an arbitrary type of memory accessed by the ASIP 23, for example, Random Access Memory (RAM), Read Only Memory (ROM), tape, a magnetic disk, an optical disk, a volatile memory, a non-volatile memory, and a combination thereof.

The main processor 27 may execute the instructions and thus may control the communication device 20. For example, the main processor 27 may control the ASIC 21 and the ASIP 23 and may process data received via a wireless communication network or a user input to the communication device 20. The main memory 29 may communicate with the main processor 27 and may store, as a non-transitory storage, the instructions executed by the main processor 27. For example, as a non-limiting example, the main memory 29 may include an arbitrary type of memory accessed by the main processor 27, for example, RAM, ROM, tape, a magnetic disk, an optical disk, a volatile memory, a non-volatile memory, and a combination thereof.

The method of measuring the reflection coefficient of an antenna may be performed by at least one of the components included in the communication device 20 of FIG. 12. According to some embodiments, an operation of the controller 117 of FIG. 1 may be implemented as a plurality of instructions stored in the memory 25, and the ASIP 23 may perform at least one of the operations of the method of measuring the reflection coefficient of an antenna, by executing the plurality of instructions stored in the memory 25. According to some embodiments, at least one of the operations of the method of measuring the reflection coefficient of an antenna may be performed by a hardware block designed by logic synthesis, and the hardware block may be included in the ASIC 21. According to some embodiments, at least one of the operations of the method of measuring the reflection coefficient of an antenna may be implemented as the plurality of instructions stored in the main memory 29, and the main processor 27 may perform at least one of the operations of the method of measuring the reflection coefficient of an antenna, by executing the plurality of instructions stored in the main memory 29.

While the inventive concept has been particularly shown and described with reference to embodiments thereof, it will be understood that various changes in form and details may be made therein without departing from the spirit and scope of the inventive concept.

What is claimed is:

1. A signal processing device for measuring a reflection coefficient of an antenna by using a radio frequency (RF) feedback signal provided by a coupler based on an RF transmission signal provided to the antenna, the signal processing device comprising:
    a digital-to-analog converter (DAC) configured to convert a first digital signal to a baseband transmission signal from which the RF transmission signal is generated;
    an analog-to-digital converter (ADC) configured to convert a baseband feedback signal generated from the RF feedback signal to a second digital signal;
    a digital signal processor configured to process the first digital signal and the second digital signal to have a target frequency band; a buffer configured to store data output by the digital signal processor; and
    a controller configured to set the target frequency band, control the digital signal processor based on the target frequency band, and calculate a reflection coefficient of the antenna corresponding to the target frequency band based on the data stored in the buffer.

2. The signal processing device of claim 1, wherein the digital signal processor comprises:
    a digital mixer configured to shift respective frequency bands of the first digital signal and the second digital signal under the control of the controller; and
    a digital filter configured to pass at least some of a plurality of frequency bands of output signals of the digital mixer under the control of the controller.

3. The signal processing device of claim 2, wherein the digital filter includes a low pass filter having a pass band corresponding to the target frequency band.

4. The signal processing device of claim 2, wherein the baseband transmission signal has a plurality of frequency bands respectively corresponding to a plurality of component carriers of the RF transmission signal, and the controller is configured to control the digital mixer such that one of the plurality of frequency bands overlaps with a pass band of the digital filter.

5. The signal processing device of claim 2, further comprising a decimator configured to down-sample the output signals of the digital filter.

6. The signal processing device of claim 1, wherein the target frequency band is narrower than the respective frequency bands of the first digital signal and the second digital signal.

7. The signal processing device of claim 1, wherein the baseband feedback signal has a frequency band shifted from a frequency band of the RF feedback signal by an analog mixer, and the controller is configured to control a frequency of an oscillation signal that is provided to the analog mixer, based on the target frequency band.

8. The signal processing device of claim 7, wherein the RF feedback signal has a plurality of frequency bands respectively corresponding to a plurality of component carriers, and the controller is configured to control a frequency of the oscillation signal to be identical with a frequency of one of the plurality of component carriers.

9. The signal processing device of claim 1, wherein the baseband feedback signal is filtered to have a frequency band determined according to a sampling rate of the ADC.

10. The signal processing device of claim 1, wherein the coupler is switchable between forward coupling and reverse coupling under the control of the controller, and the controller is configured to calculate the reflection coefficient of the antenna, based on data stored in the buffer when the coupler is set as the forward coupling and data stored in the buffer when the coupler is set as the reverse coupling.

11. The signal processing device of claim 1, wherein the ADC is configured to convert, at a first sampling rate, a baseband reception signal generated from an RF reception signal received via the antenna, in a reception mode, and to convert the baseband feedback signal at a second sampling rate lower than the first sampling rate in an antenna tuning mode.

12. The signal processing device of claim 1, wherein the controller is configured to generate an antenna tuning signal based on the calculated reflection coefficient, for adjusting an impedance of the antenna.

13. The signal processing device of claim 1, wherein the controller is configured to detect an external object near the antenna, based on the calculated reflection coefficient and a designed reflection coefficient of the antenna.

14. A device for measuring a reflection coefficient of an antenna by using a radio frequency (RF) feedback signal provided by a coupler based on an RF transmission signal provided to the antenna, the device comprising:
    a feedback circuit configured to generate a baseband feedback signal by down-converting and filtering the RF feedback signal; and
    a signal processing device configured to convert a first digital signal into a baseband transmission signal, convert the baseband feedback signal into a second digital signal, and calculate a reflection coefficient of the antenna corresponding to a target frequency band by performing digital signal processing so that the first digital signal and the second digital signal have the target frequency band,
    wherein the feedback circuit comprises an analog filter having a pass band that is narrower than a maximum frequency band of the baseband transmission signal.

15. The device of claim 14, wherein the signal processing device comprises an analog-to-digital converter (ADC) configured to convert, at a first sampling rate, a baseband reception signal generated from an RF reception signal received via the antenna, in a reception mode, and to convert the baseband feedback signal at a second sampling rate lower than the first sampling rate in an antenna tuning mode.

16. The device of claim 15, wherein the second sampling rate is determined based on a pass band of the analog filter.

17. The device of claim 14, wherein the feedback circuit comprises an analog mixer configured to shift a frequency band of the RF feedback signal, and the signal processing device is configured to control the analog mixer, based on the target frequency band.

18. A device for measuring a reflection coefficient of an antenna by using a radio frequency (RF) feedback signal provided by a coupler based on an RF transmission signal provided to the antenna, the device comprising:
    a feedback circuit configured to generate a baseband feedback signal by down-converting and filtering the RF feedback signal; and
    a signal processing device configured to control the down-converting based on a target frequency band, process a baseband transmission signal and the baseband feedback signal to have the target frequency band, and calculate a reflection coefficient of the antenna corresponding to the target frequency band, wherein the RF transmission signal is generated from the baseband transmission signal.

19. The device of claim 18, wherein the feedback circuit comprises an analog mixer configured to shift a frequency band of the RF feedback signal, and the device further comprises a local oscillator configured to provide the analog mixer with an oscillation signal, and the signal processing device is configured to control a frequency of the oscillation signal based on the target frequency band.

20. The device of claim 19, wherein the RF feedback signal has a plurality of frequency bands respectively corresponding to a plurality of component carriers, and the signal processing device is configured to control a frequency of the oscillation signal to be identical with a frequency of one of the plurality of component carriers.

21. A wireless communication apparatus comprising:
    an antenna;
    a transceiver providing a radio frequency (RF) transmission signal based on a baseband signal; a signal processor providing the baseband signal to the transceiver based on a digital transmission signal; and
    a coupler providing the RF transmission signal to the antenna, and outputting one of a first feedback signal based on the RF transmission signal and a second feedback signal based on a signal reflected from the antenna, to the signal processor,
    wherein the signal processor performs an analog to digital conversion on the first feedback signal and the second feedback signal to generate digital feedback signals,
    wherein the signal processor adjusts the digital transmission signal and the digital feedback signals to have a target frequency band, and
    wherein the signal processor determines a reflection coefficient of the antenna from the adjusted signals.

22. The wireless communication apparatus of claim 21, further comprising an antenna tuner configured to adjust an impedance of the antenna based on the reflection coefficient.

* * * * *